US010566527B2

(12) United States Patent
He et al.

(10) Patent No.: US 10,566,527 B2
(45) Date of Patent: Feb. 18, 2020

(54) METHOD FOR FABRICATION OF A CEM DEVICE

(71) Applicant: ARM Ltd., Cambridge (GB)

(72) Inventors: Ming He, San Jose, CA (US); Paul Raymond Besser, Sunnyvale, CA (US)

(73) Assignee: ARM, Ltd., Cambridge (GB)

(*) Notice: Subject to any disclaimer, the term of this patent is extended or adjusted under 35 U.S.C. 154(b) by 0 days.

(21) Appl. No.: 15/933,747

(22) Filed: Mar. 23, 2018

(65) Prior Publication Data

US 2019/0296231 A1   Sep. 26, 2019

(51) Int. Cl.
*H01L 45/00*   (2006.01)

(52) U.S. Cl.
CPC ........ *H01L 45/1233* (2013.01); *H01L 45/146* (2013.01); *H01L 45/1625* (2013.01); *H01L 45/1633* (2013.01); *H01L 45/1675* (2013.01)

(58) Field of Classification Search
CPC .............. H01L 45/1233; H01L 45/146; H01L 45/1625; H01L 45/1633; H01L 45/1675; H01L 45/12; H01L 45/1608; H01L 45/14; H01L 45/1683; H01L 45/1641; H01L 49/003
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,627,615 B1 | 4/2017 | Reid et al. | |
| 9,653,682 B1 | 5/2017 | Chou et al. | |
| 9,997,702 B2 | 6/2018 | Reid et al. | |
| 2006/0019485 A1 | 1/2006 | Komai et al. | |

(Continued)

FOREIGN PATENT DOCUMENTS

WO   2009140305 A1   11/2009
WO   2017160233 A1   9/2017

OTHER PUBLICATIONS

Notification of Transmittal of the International Search Report and Written Opinion of the International Searching Authority, or the Declaration, App. No. PCT/GB2019/050562, dated Jun. 17, 2091, 1 page.

(Continued)

*Primary Examiner* — Shahed Ahmed
(74) *Attorney, Agent, or Firm* — Berkeley Law & Technology Group, LLP

(57) ABSTRACT

Disclosed is a method for the fabrication of a correlated electron material (CEM) device comprising: forming a layer of a conductive substrate on a substrate; forming a layer of a correlated electron material on the layer of conductive substrate; forming a layer of a conductive overlay on the layer of correlated electron material; patterning these layers to form a stack comprising a conductive substrate, a CEM layer and a conductive overlay, on the substrate; forming a cover layer of an insulating material over the stack; and patterning the cover layer wherein: the patterning of the cover layer comprises etching a trench in the cover layer whereby to expose the conductive overlay; and the method further comprises treating the exposed conductive overlay to remove an oxidation layer there from.

12 Claims, 7 Drawing Sheets

(56) References Cited

U.S. PATENT DOCUMENTS

| | | | |
|---|---|---|---|
| 2008/0106925 A1* | 5/2008 | Paz de Araujo | H01L 45/04 365/148 |
| 2008/0106926 A1* | 5/2008 | Brubaker | H01L 27/2409 365/148 |
| 2008/0107801 A1* | 5/2008 | Celinska | H01L 45/04 427/96.7 |
| 2009/0090899 A1 | 4/2009 | Lim et al. | |
| 2013/0009128 A1* | 1/2013 | Ribeiro | H01L 27/2463 257/9 |
| 2013/0112935 A1 | 5/2013 | Himeno et al. | |
| 2013/0286458 A1* | 10/2013 | Lamine | G02F 1/155 359/265 |
| 2014/0097396 A1 | 4/2014 | Murase et al. | |
| 2014/0131654 A1 | 5/2014 | Tu et al. | |
| 2015/0243708 A1 | 8/2015 | Ravasio et al. | |
| 2016/0268505 A1 | 9/2016 | Sung et al. | |
| 2017/0213960 A1 | 7/2017 | Paz De Araujo et al. | |
| 2017/0237001 A1 | 8/2017 | Reid et al. | |
| 2017/0301859 A1 | 10/2017 | Paz De Araujo et al. | |
| 2017/0317143 A1 | 11/2017 | Chen et al. | |
| 2018/0013062 A1 | 1/2018 | Reid et al. | |
| 2018/0019394 A1 | 1/2018 | Reid et al. | |
| 2018/0053892 A1 | 2/2018 | Reid et al. | |
| 2018/0096713 A1 | 4/2018 | Chandra et al. | |
| 2018/0159028 A1 | 6/2018 | Shifren et al. | |
| 2018/0159029 A1 | 6/2018 | Paz De Araujo et al. | |
| 2018/0159031 A1 | 6/2018 | Paz De Araujo et al. | |
| 2018/0175290 A1 | 6/2018 | Reid et al. | |
| 2019/0146295 A1* | 5/2019 | Parker | G02F 1/1523 |

OTHER PUBLICATIONS

International Search Report, App. No. PCT/GB2019/050562, dated Jun. 17, 2019, 6 pages.

Written Opinion, App. No. PCT/GB2019/050562, dated Jun. 17, 2019, 13 pages.

Notification of Transmittal of the International Search Report and the Written Opinion of the International Searching Authority, or the Declaration, App. No. PCT/GB2019/050559, dated Jun. 11, 2019, 1 Page.

International Search Report, App. No. PCT/GB2019/050559, dated Jun. 11, 2019, 6 Pages.

Written Opinion of the International Searching Authority, App. No. PCT/GB2019/050559, 17 Pages.

Notification of Transmittal of the International Search Report and the Written Opinion of the International Searching Authority, or the Declaration, App. No. PCT/GB2019/050479, Filed Feb. 21, 2019, dated Oct. 22, 2019, 1 Page.

International Search Report, App. No. PCT/GB2019/050479, Filed Feb. 21, 2019, dated Oct. 22, 2019, 6 Pages.

Written Opinion of the International Searching Authority, App. No. PCT/GB2019/050479, Filed Feb. 21, 2019, dated Oct. 22, 2019, 10 Pages.

\* cited by examiner

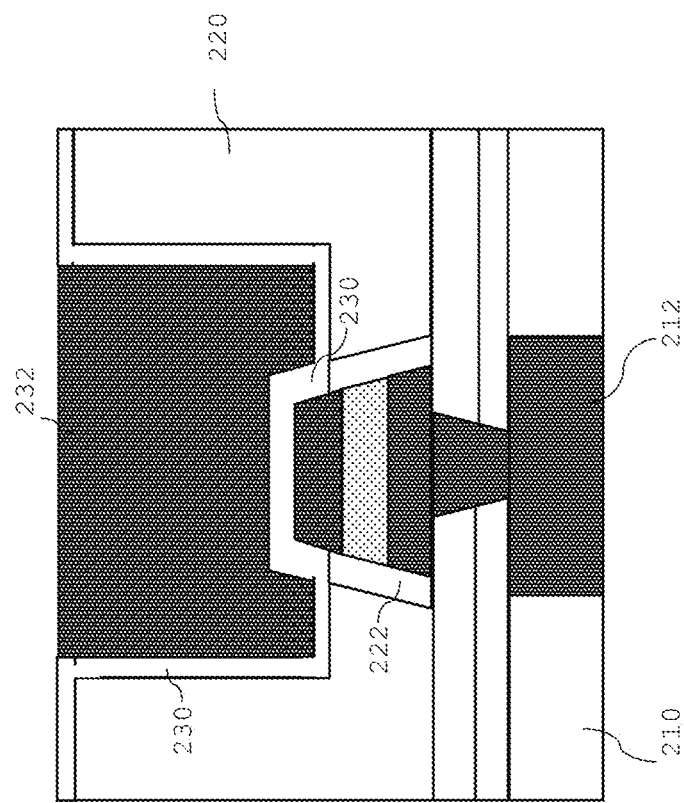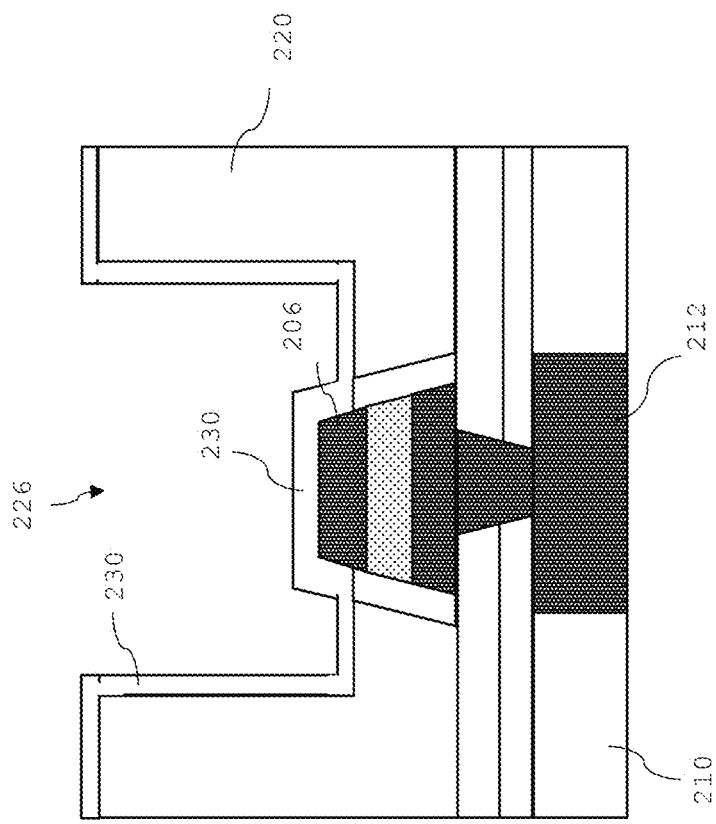

METHOD FOR FABRICATION OF A CEM DEVICE

The present disclosure is concerned with a method for the fabrication of a correlated electron material (CEM) device as well as with an integrated circuit including a CEM device obtained by the method.

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

There appears to be an ever-increasing drive towards memory and/or logic devices which can exhibit lower power and/or higher speed. Switching devices comprising a correlated electron material are at the forefront of this drive not just because they can exhibit low power and/or high speed but also because they are generally reliable and easily and cheaply manufactured.

The present disclosure describes an improved CEM device and methods for its manufacture. The CEM device may, in particular, be a switching device. The CEM switching device may find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition.

As used herein, references to a Mott transition are references to traditional Mott transitions (which are described in the literature as purely coulombic) as well as references to Mott-like transitions (in which the coulombic interaction is modified by some other electron interaction, such as a dipole-core charge interaction). Accordingly, a reference to a Mott insulator includes a reference to a charge-transfer (Mott) insulator, such as nickel (II) oxide, in which the columbic interaction or screening is modified by a charge transfer complex through hybridisation with the oxygen band.

In accordance with a Mott transition, a material may switch from a relatively insulative/higher impedance state to a relatively conductive/lower impedance state if a Mott transition condition is satisfied. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1B, a CEM switching device may comprise a layer of correlated electron material (a CEM layer) sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 102).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ applied during a write operation at point 116 to place the CEM switching device into a relatively low-impedance state, may determine a compliance condition for placing the CEM device into a high-impedance state in a subsequent write operation. As shown in FIG. 1A, the CEM device may be subsequently placed into a high-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \tag{1}$$
$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \tag{2}$$
$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$
$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

FIG. 1B shows a CEM switching device comprising a CEM layer sandwiched between a conductive substrate and a conductive overlay and FIG. 1C shows a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals. The equivalent circuit for a variable impedance device may comprise a variable resistor 192, such as variable resistor, in parallel with a variable capacitor 194. Of course, although a variable resistor and variable capacitor are depicted in FIG. 1C as comprising discrete components, the variable impedance device, such as that shown, may comprise a substantially homogenous CEM.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

Table 1 illustrates an example truth table for an example variable impedance device, such as the device of FIG. 1A. Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high impedance state, for example, via injection of a sufficient quantity of electrons to satisfy a Mott transition criterion. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$ (wherein the subscripts "x" and "y" comprise whole numbers). As the term is used herein, "back-donation" refers to a supplying of one or more (i.e. electron density) to a transition metal, transition metal oxide, or any combination thereof (i.e. to an atomic orbital of a metal), by an adjacent molecule of a lattice structure (i.e. a ligand), and at the same time donation of electron density from the metal center into an unoccupied antibonding orbital on the ligand/dopant.

The electron back-donating ligand may be a n-back-bonding ligand such as carbonyl (CO), nitrosyl (NO), an isocyanide (RNC where R is H, $C_1$-$C_6$ alkyl or $C_6$-$C_{10}$-aryl), an alkene (e.g. ethene), an alkyne (e.g. ethyne) or a phosphine such as a trialkyl phosphine or a triaryl phosphine ($R_3P$ wherein R is H, $C_1$-$C_6$-alkyl or $C_6$-$C_{20}$-aryl), for example triphenylphosphine ($PPh_3$).

Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbonyl (CO) or a nitrogen-containing dopant, such as ammonia ($NH_3$), ethylene diamine ($C_2H_8N_2$), or members of an oxynitride family (NxOy), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in nickel oxide material (e.g., $NiO:CO$ or $NiO:NH_3$), thereby permitting the nickel oxide material to switch to exhibiting a substantially dissimilar impedance property, such as a high-impedance property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance properties if the transition metal, such as nickel, for example, is placed into an oxidation state of 2+(e.g., $Ni^{2+}$ in a material, such as $NiO:CO$ or $NiO:NH_3$). Conversely, electron back-donation may be reversed if a transition metal, such as nickel, for example, is placed into an oxidation state of 1+ or 3+.

Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \tag{4}$$

Such disproportionation, in this instance, refers to formation of nickel ions as $Ni^{1+}+Ni^{3+}$ as shown in expression (4), which may bring about, for example, a relatively high-impedance state during operation of the CEM device. In an embodiment, a dopant such as a carbon-containing ligand, carbonyl (CO) or a nitrogen-containing ligand, such as an ammonia molecule ($NH_3$), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \tag{5}$$

As previously mentioned, reversal of the disproportionation reaction, as shown in expression (5), permits nickel-based CEM to return to a relatively low-impedance state.

In embodiments, depending on a molecular concentration of NiO:CO or NiO:NH$_3$, for example, which may vary from values approximately in the range of an atomic concentration of 0.1% to 10.0%, V$_{reset}$ and V$_{set}$, as shown in FIG. 1A, may vary approximately in the range of 0.1 V to 10.0 V subject to the condition that V$_{set}$ V$_{reset}$. For example, in one possible embodiment, V$_{reset}$ may occur at a voltage approximately in the range of 0.1 V to 1.0 V, and V$_{set}$ may occur at a voltage approximately in the range of 1.0 V to 2.0 V, for example. It should be noted, however, that variations in V$_{set}$ and V$_{reset}$ may occur based, at least in part, on a variety of factors, such as atomic concentration of an electron back-donating material, such as NiO:CO or NiO:NH$_3$ and other materials present in the CEM device, as well as other process variations, and claimed subject matter is not limited in this respect.

The fabrication of a CEM device into an integrated circuit generally begins with the formation of device layers by patterning a layer of a conductive substrate, a layer of a correlated electron material and a layer of a conductive overlay which have been deposited on an insulating substrate, such as silica, having one or more embedded interconnects.

The patterning, which uses a hard mask formed, for example, from silica (SiO$_2$) or silicon nitride (Si$_3$N$_4$), forms a stack from the deposited layers (and the hard mask) which may be fabricated to an integrated circuit by depositing a cover layer comprising an insulating material, such as silica, over the stack, patterning the cover layer whereby to form a trench in which the conductive overlay is exposed and depositing a metal interconnect in the trench to contact the conductive overlay.

The fabrication may further comprise depositing a layer of a metal barrier material over the exposed conductive overlay and at least the interior walls of the trench. The metal barrier layer prevents the migration of metal, for example, copper, from the metal interconnect. It also protects against the ingress of moisture from ambient or the cover layer to the stack. The metal barrier layer may, in particular, comprise one or more of tantalum nitride (TaN), titanium nitride (TiN), cobalt (Co), ruthenium (Ru) and tantalum (Ta).

Note that the patterning of the cover layer may also comprise forming an additional trench and via for an additional metal interconnect enabling contact between other devices, such as transistors, at different levels in a 3-dimensional integrated circuit.

One problem with the fabrication of a CEM device to an integrated circuit is that the fabrication processes may lead to oxidation of the upper surface of the conductive overlay. The oxidation may lead to a conductive layer of a metal oxide on the upper surface. The oxidation layer can result in an unwanted capacitance in the fabricated device which may slow down its switching performance or increase the switching voltage and power consumption.

Note that oxidation of the conductive overlay may, in particular, occur during the formation and/or the subsequent etching of the cover layer provided over the stack (and hard mask). It may additionally occur during the formation of the hard mask used for patterning the layers of conductive overlay, correlated electron material and conductive substrate as well as during the etching of those layers.

The selection of materials for the conductive overlay can to some extent mitigate against unwanted capacitance by providing that the oxidation of the conductive overlay is confined to a surface monolayer which is protective of further oxidation of the conductive overlay once it is formed.

A similar selection is used to address oxidation of the conductive substrate and/or conductive overlay by the CEM layer which can occur during the formation of the CEM layer and/or the conductive overlay and described in our co-pending U.S. patent application Ser. No. 15/207,708 (incorporated in its entirety by reference herein).

In embodiments, therefore, the conductive overlay may comprise, at least in part, one or more of a metal nitride, such as titanium nitride (TiN) or tantalum nitride (TaN), which is oxidised on its upper surface to a monolayer of oxide or oxynitride. The conductive overlay may also be oxidised on a lower surface to a monolayer of oxide or oxynitride.

In one respect, the present disclosure provides a method for the fabrication of a CEM device comprising forming a layer of a conductive substrate on a substrate; forming a layer of a correlated electron material (CEM) on the conductive substrate; and forming a layer of a conductive overlay on the CEM layer wherein the forming of layer of conductive overlay comprises sputtering the metal in an atmosphere which becomes progressively richer in nitrogen content (partial pressure) towards the upper surface of the layer.

Note that the elevated content of nitrogen in the conductive overlay is protective against the formation of an oxidation layer during the fabrication of the device to an integrated circuit.

The present disclosure is not just concerned with preventing the formation of the oxidation layer on the upper surface of the conductive overlay but also with the removal of the oxidation layer during the fabrication (towards full integration) of the device.

Accordingly, in another respect, the present disclosure provides a method for the fabrication of a correlated electron material (CEM) device comprising:

forming a layer of a conductive substrate on a substrate;
forming a layer of a correlated electron material on the layer of conductive substrate;
forming a layer of a conductive overlay on the layer of correlated electron material;
patterning these layers to form a stack comprising a conductive substrate, a CEM layer and a conductive overlay on the substrate;
forming a cover layer of an insulating material over the stack; and
patterning the cover layer wherein:
the patterning of the cover layer comprises etching a trench in the cover layer to expose the conductive overlay; and
wherein the method further comprises treating the exposed conductive overlay to remove an oxidation layer there from.

The patterning of the cover layer and/or the stack may comprise standard lithographic processes. The patterning of the stack may comprise, for example, forming a hard mask on the layer of the conductive overlay and dry etching the layer of conductive overlay, the layer of correlated electron material and the layer of conductive substrate. The hard mask may be removed prior to forming the cover layer. Alternatively, it may remain in the stack during the forming of the cover layer and be removed from the stack with the etching of the trench in the cover layer.

The method preferably, although not essentially, comprises etching (for example, dry etching) the trench so as to expose substantially the whole (for example, from 90% to 100%) of the upper surface of the conductive overlay. In one embodiment, the trench may surround the conductive overlay.

The method may also comprise etching the trench in the cover layer to a depth which exposes a part, or substantially the whole (for example, from 90% to 100%) of the side walls of the conductive overlay in the trench.

The treatment of the exposed conductive overlay may, therefore, remove an oxidation layer not just from an upper surface of the exposed conductive overlay but also from its sidewalls.

In one embodiment, the treatment comprises sputtering the exposed conductive overlay in an inert atmosphere (such as argon) so that at least a part of the conductive overlay is vaporized and deposited back within the trench. Of course, the process will provide that substantially the whole (for example, from 90% to 100%) of the width of the upper surface of the conductive overlay is re-deposited on the conductive overlay within the trench.

Note that a sputtering chamber can be integrated into the barrier deposition chamber which presently exists within the high-volume manufacturing (HVM) tools used for the fabrication of integrated circuits.

In another embodiment, the method comprises treating the exposed conductive overlay with a reducing gas so as to reduce the metal oxide of the oxidation layer to metal or metal nitride at suitable temperature and pressure.

The reducing gas may, for example, comprise nitrogen ($N_2$), hydrogen ($H_2$), ammonia ($NH_3$) or hydrazine ($NH_2NH_2$) or mixtures thereof. The temperature may, for example, be between 150° C. to 700° C. and the pressure may, for example, be between 1 atm. and 5 atm. A remote plasma derived from these gases may also be used under these conditions.

Note that a reaction chamber for this treatment can be integrated into the metal barrier layer deposition chamber which presently exists within the high-volume manufacturing (HVM) tools used for the fabrication of integrated circuits.

In another embodiment, the method may comprise treating the exposed conductive overlay with an etchant which is specific for the oxidation layer. The treatment may be, in particular, comprise a wet strip using an etchant, such as dilute hydrofluoric acid (DHF), during a predetermined period at a suitable temperature between, for example, 25° C. and 250° C. and pressure and between, for example, 1 atm. and 5 atm.

In any case, the method may comprise a treatment which removes substantially the whole (for example, from 85% or 90% to 100%) of the oxidation layer on the exposed conductive overlay.

Note also that a (wet) strip chamber can be integrated into the metal barrier layer deposition chamber which presently exists within the high-volume manufacturing (HVM) tools used for the fabrication of integrated circuits.

The integration of chambers prevents re-oxidation of the conductive overlay during the exposure to ambient atmosphere which may otherwise be necessary.

The method may further comprise depositing a metal interconnect over the treated conductive overlay whereby to substantially fill the trench. The metal interconnect may comprise aluminium, cobalt, ruthenium, tungsten or copper. The deposition of a copper interconnect may, in particular, be carried out by electroplating (with subsequent chemical and/or mechanical polishing).

The method may further comprise depositing a moisture barrier layer over the stack prior to the deposition of the cover layer. The moisture barrier layer, which may, for example, comprise silicon nitride ($Si_3N_4$), silicon carbon nitride (SiCN) or silicon carbide (SiC), prevents the ingress of moisture, for example, from ambient or from the etching of the cover layer, into the sidewalls of the fabricated device.

Note that in one embodiment, the hard mask is etched away from the upper surface of the conductive overlay when the trench is etched in the cover layer. The etching also removes the barrier layer from the upper surface (and the sidewalls) of the conductive overlay when the trench is etched in the cover layer. In the fabricated device, therefore, the barrier layer may cover the sidewalls of the conductive substrate and the sidewalls of the CEM layer but only a portion of the sidewalls of the conductive overlay up to the metal interconnect.

The method may further comprise depositing a metal barrier layer over the treated conductive overlay and at least the interior walls of the trench prior to depositing the metal interconnect. The metal barrier layer prevents the migration of metal ion from the first and second interconnect into the cover plate and the device. It also protects against the ingress of moisture from ambient or the cover layer to the stack. The metal barrier layer may, in particular, comprise one or more of tantalum nitride (TaN), titanium nitride (TiN), cobalt (Co), ruthenium (Ru) and tantalum (Ta).

The forming of the layer of conductive overlay, the layer of correlated electron material and the layer of conductive substrate may comprise any suitable physical vapour deposition or chemical vapour deposition. In embodiments, the forming of at least the CEM layer comprises a chemical vapour deposition and, in particular, an atomic layer deposition.

In embodiments, the method may comprise forming a layer of a correlated electron material comprising a doped metal compound of a d- or f-block element (especially one exhibiting an incomplete d- or f-block shell) such as nickel, cobalt, iron, yttrium or ytterbium. It may comprise forming a CEM layer comprising an oxide of a d- or f-block element and, in particular, a transition metal oxide (TMO) such as nickel oxide, cobalt oxide, iron oxide or an oxide or a rare earth element such as yttrium oxide.

The method may alternatively comprise forming a layer of a correlated electron material comprising a complex (or "mixed") oxide of d- and/or f-block elements, for example, as a perovskite such as chromium doped strontium titanate, lanthanum titanate, praseodymium calcium manganate or praseodymium lanthanum manganate or a complex oxide or a rare earth element and a transition metal such as yttrium titanium oxide or ytterbium titanium oxide.

In embodiments, the metal compound of the correlated electron material may be of general formula $AB:L_x$ (for example, NiO:CO) wherein the AB denotes, for example, a transition metal compound, such as a transition metal oxide, $L_x$ denotes an extrinsic ligand for the metal and x indicates the number of units of ligand for one unit of the transition metal or transition metal compound. The value of x for any specific ligand and any specific combination of ligand with a transition metal oxide may be determined simply by balancing valences.

In embodiments, the method may form a CEM layer comprising doped nickel oxide, such as $NiO:L_x$, wherein the dopant comprising a back-donating ligand comprises a molecule of the form $C_aH_bN_dO_f$ (in which a≥1, and b, d and f≥0) such as: carbonyl (CO), cyano ($CN^-$), ethylenediamine ($C_2H_8N_2$), 1, 10-phenanthroline ($C_{12}H_8N_2$), bipyridine ($C_{10}H_8N_2$), pyridine ($C_5H_5N$), acetonitrile ($CH_3CN$) and cyanosulfanides such as thiocyanate ($NCS^-$).

The forming of the layer of correlated electron material may, in particular, use a physical vapour deposition, such as reactive sputtering, of a transition metal compound, for example, a transition metal oxide, in an atmosphere of a gaseous oxide, such as carbon monoxide (CO).

The forming of the layer of correlated electron material may, in particular, comprise a chemical vapour deposition, such as an atomic layer deposition (ALD), of a transition metal compound, for example, a transition metal oxide.

The atomic layer deposition may form the layer utilising separate precursor molecules AX and BY, according to the expression (6) below:

$$AX_{(gas)} + BY_{(gas)} = AB_{(solid)} + XY_{(gas)} \qquad (6)$$

wherein "A" of expression (4) corresponds to the transition metal, and "AB" a transition metal compound, such as a transition metal oxide.

The "X" of expression (4) may comprise one or more of an organic or other ligand, such as amidinate (AMD), cyclopentadienyl (Cp), bis(ethylcylcopentadienyl) ((EtCp)$_2$), bis(pentamethylcyclo-pentadienyl) (C$_5$(CH$_3$)$_5$)$_2$ bis(2,2,6,6-tetramethylheptane-3,5-dionato) ((thd)$_2$), acetylacetonato (acac), bis(methylcyclopentadienyl) ((MeCp)$_2$), dimethylglyoximato (dmg)$_2$, (apo)$_2$ where apo is 2-aminopent-2-ene-4-onato, (dmamb)$_2$ where dmamb is 1-dimethylamino-2-methyl-2-butanolato, (dmamp)$_2$ where dmamp is 1-dimethylamino-2-methyl-2-propanolato.

Suitable precursor molecules AX include organometallic compounds of the transition metals having one or more of these ligands alone or in combination together with other ligands.

Accordingly, in some embodiments, a nickel based precursor AX (NiX) may comprise, for example, nickel amidinate (Ni(AMD)), bis(cyclopentadienyl)nickel (Ni(Cp)$_2$), nickel acetoacetonate (Ni(acac)$_2$), nickel dimethylglyoximate (Ni(dmg)$_2$), bis(ethylcyclo-pentadienyl) nickel (Ni(EtCp)$_2$), bis(methylcyclopentadienyl)nickel (Ni(CH$_3$C$_5$H$_4$)$_2$), bis(pentamethylcyclopentadienyl)nickel (Ni(C$_5$(CH$_3$)$_5$)$_2$), nickel 2-amino-pent-2-en-4-anato (Ni(apo)$_2$), Ni(dmamb)$_2$ where dmamb is 1-dimethylamino-2-methyl-2-butanolato, Ni(dmamp)$_2$ where dmamp is 1-dimethylamino-2-methyl-2-propanolato.

The precursor "BY" in expression (4) may comprise a gaseous oxide (as an oxidant), such as water (H$_2$O), oxygen (O$_2$), ozone (O$_3$), nitric oxide (NO), nitrous oxide (N$_2$O) hydrogen peroxide (H$_2$O$_2$) or plasma-formed oxygen radical (O$^-$).

In embodiments, the conductive overlay and/or the conductive substrate comprise a major (bulk) layer comprising a conductive metal nitride and a minor layer comprising a noble metal or a conductive metal oxide.

Accordingly, the forming of the layer of conductive substrate comprises depositing a first layer of a metal nitride and depositing a second layer of a noble metal or other conductive material on the first layer. And the forming of the conductive overlay may comprise depositing a first layer of a noble metal or other conductive material and depositing a second layer of a metal nitride on the first layer.

The metal nitride may comprise one or more of titanium nitride, tantalum nitride, and tungsten nitride. The noble metal or other conductive material may comprise platinum, titanium, copper, aluminium, cobalt, nickel, tungsten, cobalt silicide, ruthenium oxide, chromium, gold, palladium, indium tin oxide, tantalum, silver, iridium, iridium oxide or any combination thereof.

The substrate may comprise an insulating material, such as silica, provided on an underlying dielectric material, which includes a via for contacting the conductive substrate with a metal interconnect in the dielectric material. A moisture barrier layer (for example, of silicon nitride (Si$_3$N$_4$), silicon carbon nitride (SiCN) or silicon carbide (SiC)) may be provided between the insulating and dielectric materials.

In one embodiment, the substrate comprises a fluorosilicate glass (FSG) plate including a via for contacting the conductive substrate with a copper interconnect in an underlying dielectric material. A moisture barrier layer comprising silicon nitride (Si$_3$N$_4$) may be provided between the dielectric material and the glass plate.

The present disclosure also provides an integrated circuit having a CEM device comprising a conductive substrate, a CEM layer and a conductive overlay wherein the device is provided between an upper metal interconnect provided in a cover layer and a lower metal interconnect provided in a substrate, the upper metal interconnect and the conductive overlay having a trench contact, wherein the contacting surface of the conductive overlay is substantially free from an oxidation layer.

The present disclosure also provides an integrated circuit having a CEM device comprising a conductive substrate, a CEM layer and a conductive overlay, wherein the device is provided between an upper metal interconnect provided in a cover layer and a lower metal interconnect provided in a substrate, the upper metal interconnect and the conductive overlay having a trench contact and the lower metal interconnect and the conductive substrate having a via contact, wherein the device has a moisture barrier layer on substantially the whole of the sidewalls of the conductive substrate and the CEM layer and on the sidewalls of the conductive overlay below and up to the trench contact.

The present disclosure further provides an electronic device comprising an integrated circuit having a CEM device comprising a conductive substrate, a CEM layer and a conductive overlay wherein the device is provided between an upper metal interconnect provided in a cover layer and a lower metal interconnect provided in a substrate, the upper metal interconnect and the conductive overlay having a trench contact, wherein the contacting surface of the conductive overlay is substantially free from an oxidation layer.

The present disclosure also provides a CEM device comprising a conductive substrate, a CEM layer and a conductive overlay wherein the device is provided between an upper metal interconnect provided in a cover layer and a lower metal interconnect provided in a substrate, the upper metal interconnect and the conductive overlay having a trench contact and the lower metal interconnect and the conductive substrate having a via contact, wherein the device has a moisture barrier layer on substantially the whole of the sidewalls of the conductive substrate and the CEM layer and on the sidewalls of the conductive overlay below and up to the trench contact.

The present disclosure further provides a CEM device comprising a conductive substrate, a CEM layer and a conductive overlay wherein the device is provided between an upper metal interconnect provided in a cover layer and a lower metal interconnect provided in a substrate, the upper metal interconnect and the conductive overlay having a trench contact, wherein the contacting surface of the conductive overlay is substantially free from an oxidation layer.

Embodiments in the integrated circuit, CEM device or electronic device will be apparent from the description of embodiments of the method of the present disclosure.

Note, in particular, that the CEM layer may be interposed between the conductive substrate and the conductive overlay.

The method, fabricated CEM device and integrated circuit according to the present disclosure will now be described in more detail having regard to the following non-limiting embodiments and the accompanying drawings in which:

FIGS. 6A and 6B are schematic illustrations showing the deposition of a metal interconnect over the metal barrier layer whereby to substantially fill the trench.

Figure 1C:
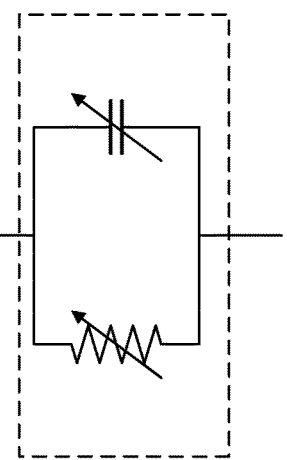
FIG. 1C shows a schematic diagram of an equivalent circuit for the switching device.
Figure 1A:
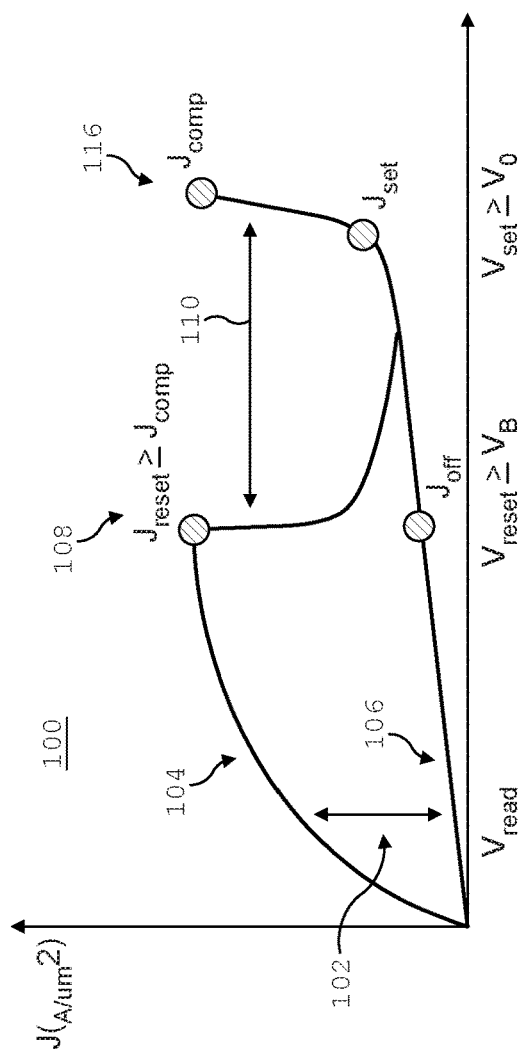
FIG. 1A shows a schematic illustration of a current density versus voltage profile of a CEM switching device.
Figure 1B:
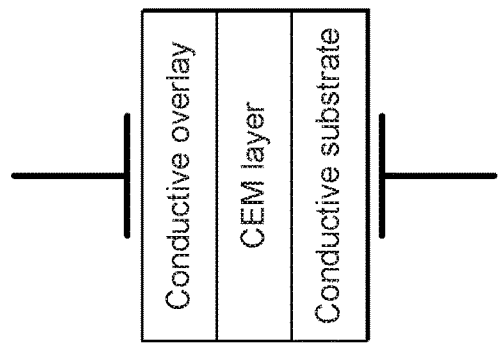
FIG. 1B shows a schematic illustration of the CEM switching device of FIG. 1A.
Figures 2A, 2B:
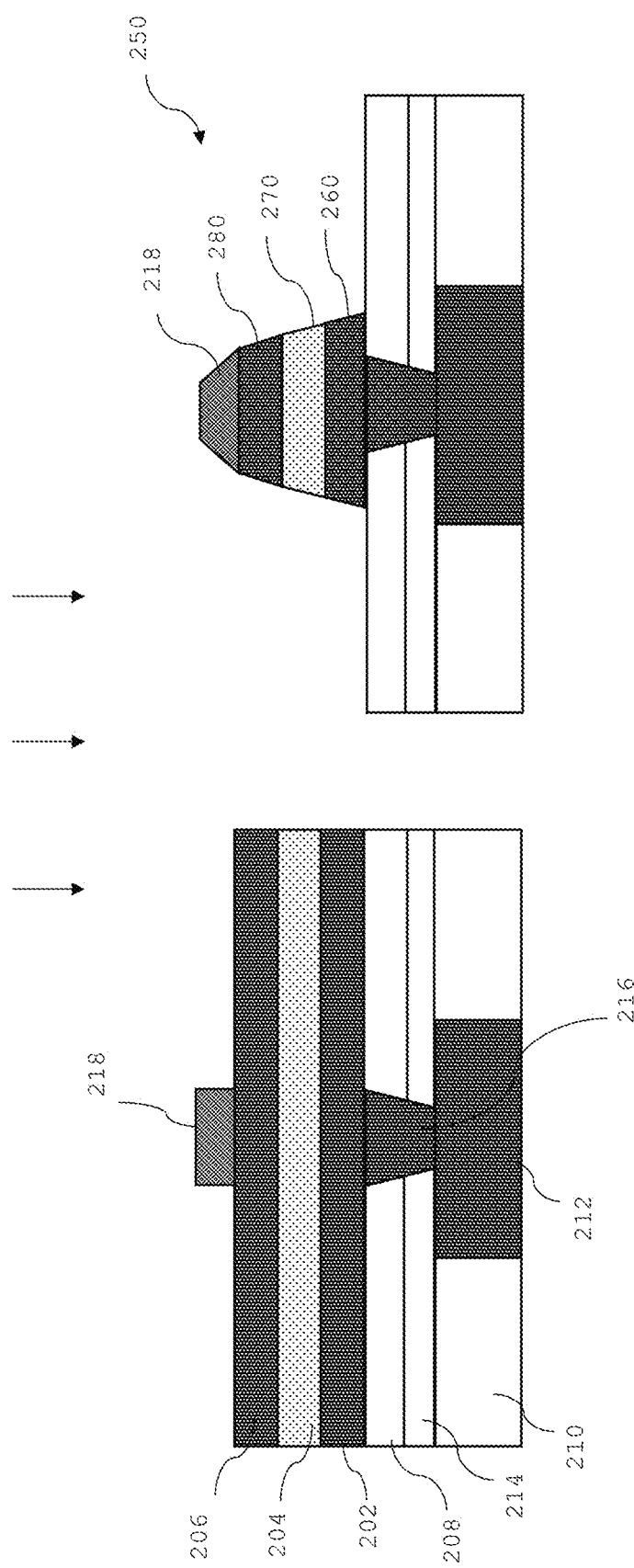
FIGS. 2A and 2B are schematic illustrations showing the dry etching of a layer of conductive substrate, a layer of correlated electron material and a layer of conductive overlay to form a stack for a CEM switching device.

Referring now to FIGS. 2A and 2B, there is shown a scheme generally illustrating the dry etching of a layer of a conductive substrate 202, a layer of a correlated electron material 204 and a layer of a conductive overlay 206 to from a stack, generally designated 250, comprising a conductive overlay 280, a CEM layer 270 and a conductive substrate 260 for a CEM switching device.

The CEM layer 270 may, in particular, comprise a doped nickel oxide NiO:C as described above. The conductive substrate 260 and the conductive layer 280 may each comprise a first (bulk) layer comprising tantalum nitride (TaN) and a second layer (liner) comprising iridium (not shown). The iridium layer in both the conductive overlay 280 and the conductive substrate 260 contacts the CEM layer 270.

Referring now to FIG. 2A, these layers are provided on a (FSG) glass (SiO$_2$) plate 208 which is in turn disposed on a lower substrate 210 (comprising a low k) dielectric material) in which a lower copper interconnect 212 is provided. The dielectric material may comprise (FSG) silica (SiO$_2$).

A silicon nitride (Si$_3$N$_4$) barrier layer 214 is provided between the substrate 210 and the glass plate 208. The glass plate 208 and the barrier layer 214 include a via 216 providing contact between the conductive substrate 202 and the copper interconnect 212.

A hard mask 218 comprising a layer of a silica (SiO$_2$) is provided on the conductive overlay 206. The hard mask 218, which may be formed by a standard photolithographic process using a photoresist and reactive ion etching, defines the lateral dimensions of the (trapezoidal) CEM switching device.

Referring now to FIG. 2B, the dry etching (for example, reactive ion etching or deep reactive ion etching) results in a stack 250 which is ready for integration with a (FSG) glass (SiO$_2$) cover layer.

Figure 3A:
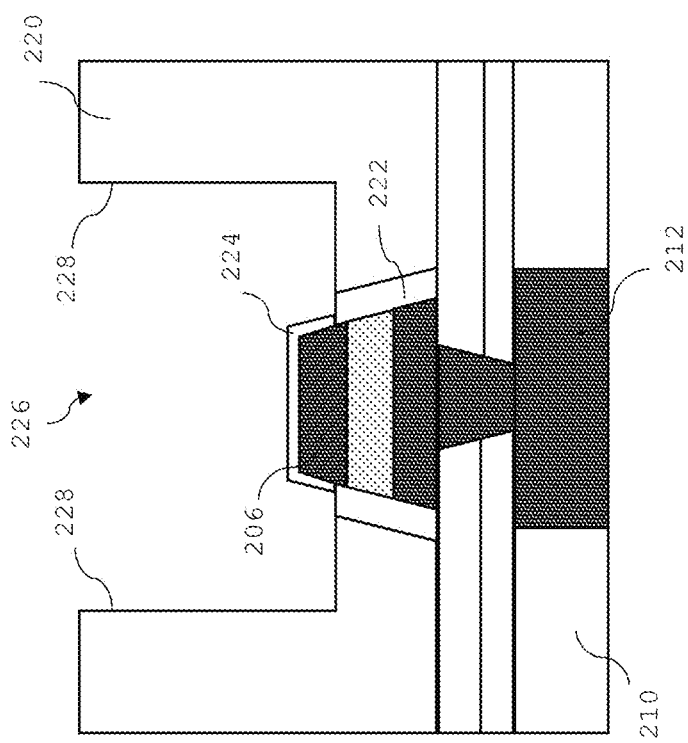
FIGS. 3A and 3B are schematic illustrations showing the forming of a trench in a cover layer of insulating material which has been provided over the stack whereby to expose the conductive overlay.
Figure 3B:
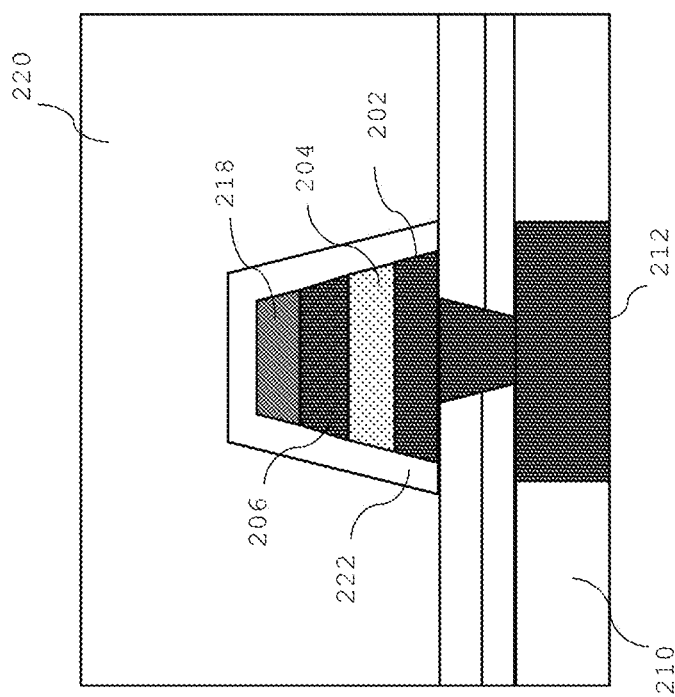

Referring now to FIGS. 3A and 3B, there is shown the etching of a (FSG) glass cover layer 220 which has been deposited over the stack 250.

Referring to FIG. 3A, note that the deposition of the glass cover layer 220 is preceded by a deposition of a silicon nitride (Si$_3$N$_4$) moisture barrier layer 222 over the hard mask 218.

Referring now to FIG. 3B, the etching of the glass cover layer 220 results in a trench 226 having interior sidewalls 228 within which the conductive overlay 206 (in part) protrudes.

Note that the moisture barrier layer 222, is etched away at and around the upper surface of the conductive overlay during the etching of the cover layer 220.

Note also that the hard mask is removed during the etching of the cover layer 220 and that the conductive overlay 206 has an oxidation layer 224 on and around its upper surface which is formed during the etching of the cover layer 220.

Figure 4B:
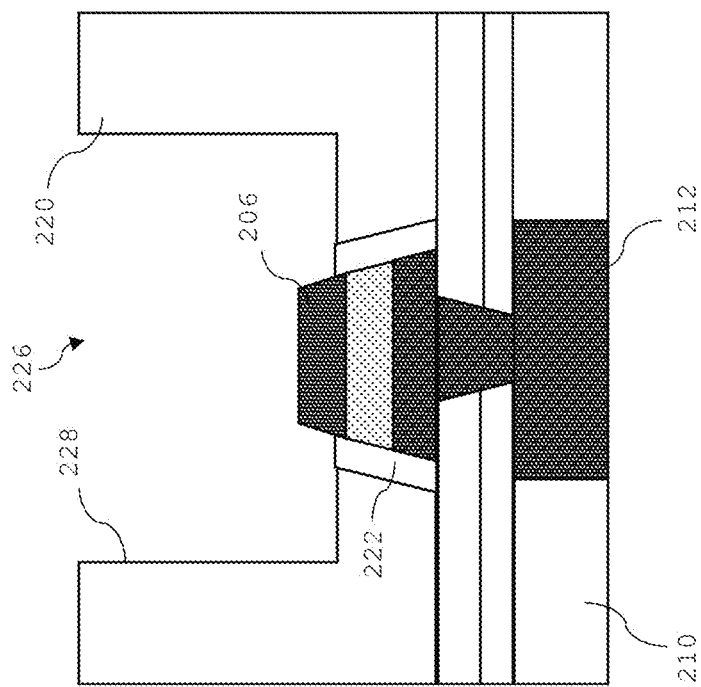
FIGS. 4A and 4B are schematic illustrations showing the removal of an oxidation layer formed on the upper surface and part of the sidewalls of a conductive overlay.
Figure 4A:
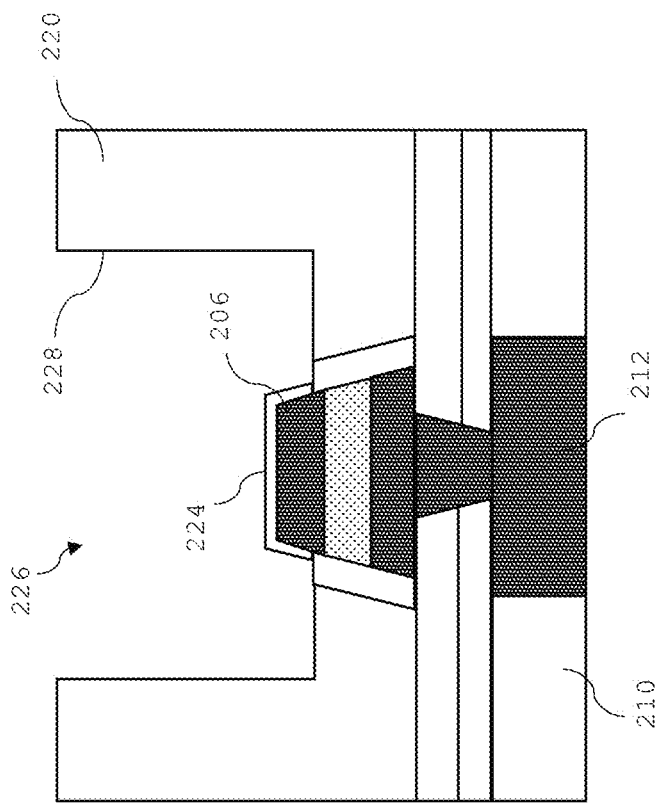

Referring now to FIGS. 4A and 4B, there is shown the removal of the oxidation layer 224 by treatment of the exposed conductive overlay 206.

As mentioned above, the oxidation layer 224 of the conductive overlay 206 may be removed by re-sputtering the conductive overlay 206 within the trench 226 or by exposure of the conductive overlay 206 to a reducing gas, such as hydrogen (H$_2$), nitrogen (N$_2$) or ammonia (NH$_3$), or by a wet cleaning chemical, such as dilute hydrofluoric acid (DHF).

The re-sputtering may be carried out in a chamber provided for the (subsequent step) deposition of the metal barrier layer.

Figure 5B:
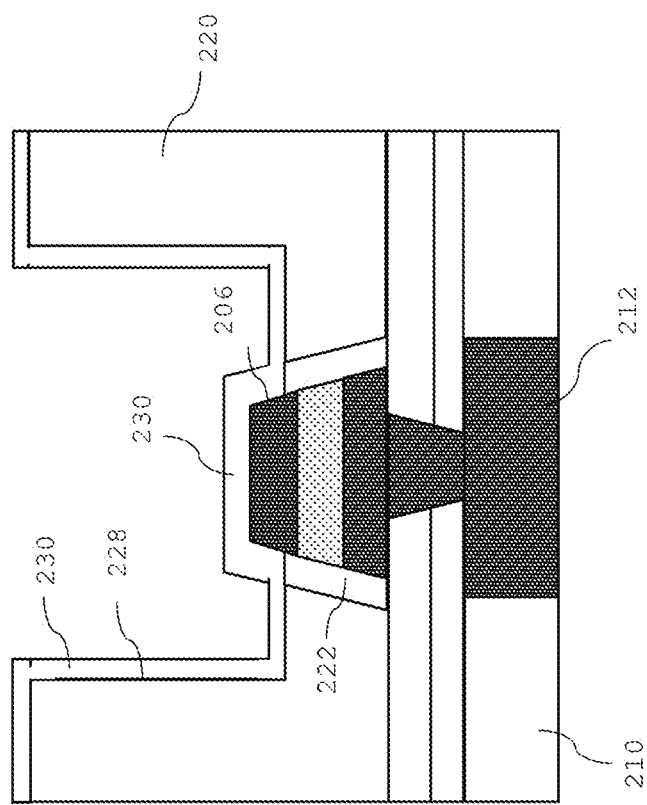
FIGS. 5A and 5B are schematic illustrations showing the formation of a metal barrier layer over the treated conductive overlay and at least the interior walls of the trench.
Figure 5A:
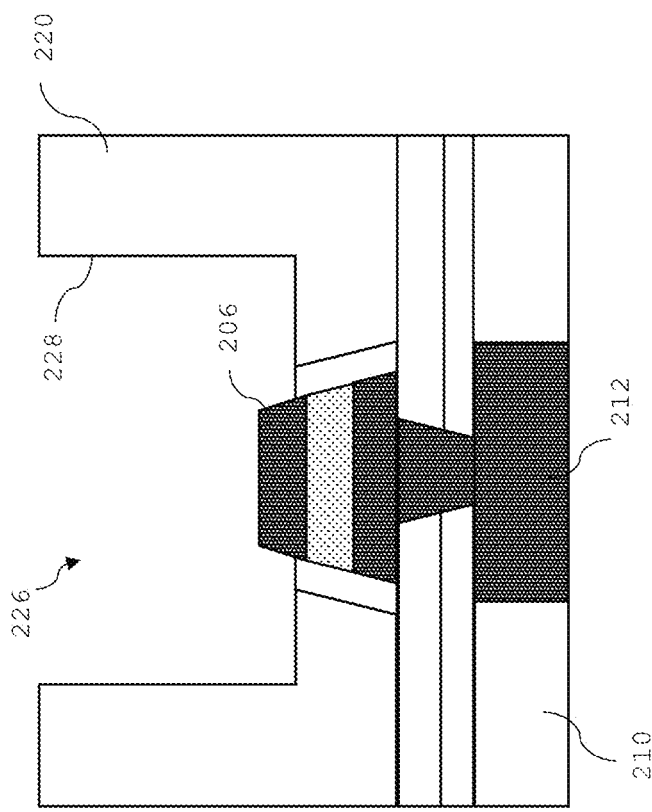

Referring now to FIGS. 5A and 5B, there is shown the deposition of a metal barrier layer 230 over the conductive overlay 206, the bottom and at least the interior walls 228 of the trench 226.

Referring now to FIGS. 6A and 6B, there is shown the deposition of a copper interconnect 232 to fill the trench 226 and contact the conductive overlay 206 and the barrier layer 230.

Figure 7:
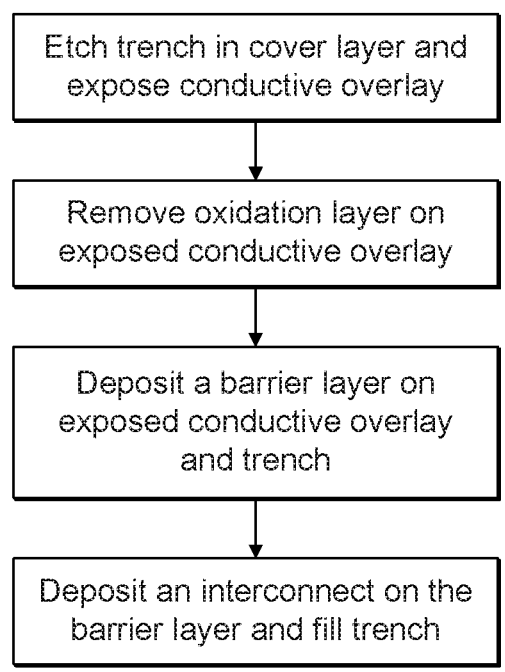
FIG. 7 is a flow diagram highlighting the steps for the removal of an oxidation layer which has formed on the upper surface and part of the sidewalls of a conductive overlay during the fabrication of a device.

Referring now to FIG. 7, there is shown a flow diagram illustrating a method for the fabrication of a device with removal of an oxidation layer on the conductive overlay which has formed during the processing.

As may be seen, the method provides that a trench is etched in an insulating cover layer for the device so as to expose the conductive overlay within the trench.

The exposed conductive overlay is subsequently treated to remove the oxidation layer that has formed on the conductive overlay because of the processing of the device (for example, from the etching of the trench in the cover layer).

The method includes the deposition of a metal barrier layer comprising, for example, titanium nitride or tantalum nitride, after the treatment to remove the oxidation layer of the conductive overlay.

The metal barrier layer, which coats the treated conductive overlay, the bottom of the trench and, at least, the interior side walls of the trench, prevents the ingress of moisture into the fabricated device.

The method further includes the deposition of a metal interconnect in the trench whereby to cover the coated conductive overlay and to fill the trench.

The invention claimed is:

1. A method for the fabrication of a device comprising:
   forming a layer of a conductive substrate;
   forming a layer of a correlated electron material (CEM) on the layer of conductive substrate;
   forming a layer of a conductive overlay on the layer of the CEM;
   patterning the layer of the conductive substrate, the layer of the CEM and the layer of the conductive overlay to form a stack;
   forming a cover layer of an insulating material over the stack;
   patterning the cover layer by etching a trench in the cover layer to expose at least a portion of the layer of the conductive overlay; and
   treating the exposed at least a portion of the layer of the conductive overlay to remove at least a portion of an oxidation layer there from.

2. The method according to claim 1, wherein treating the exposed conductive overlay removes the at least a portion of the oxidation layer from the at least a portion of the upper surface and at least a portion of sidewalls of the exposed conductive overlay.

3. The method according to claim 1, wherein treating the exposed conductive overlay comprises sputtering the layer of the conductive overlay within the trench.

4. The method according to claim 1, wherein treating the exposed conductive overlay comprises exposing the layer of the conductive overlay to a reducing gas.

5. The method according to claim 4, wherein the reducing gas comprises an inert gas comprising hydrogen, ammonia or hydrazine, or a combination thereof.

6. The method according to claim 1, wherein treating the exposed at least a portion of the layer of the conductive overlay comprises contacting the exposed at least a portion of the layer of the conductive overlay with a wet etchant for application to the oxidation layer.

7. The method according to claim 6, wherein the etchant comprises dilute hydrofluoric acid.

8. The method according to claim 1, further comprising depositing a moisture barrier layer over the stack prior to the forming of the cover layer.

9. The method according to claim 8, wherein the moisture barrier layer comprises silica, silicon nitride or silicon carbon nitride, or a combination thereof.

10. The method according to claim 1, further comprising depositing a metal barrier layer over the treated exposed at least a portion of the conductive overlay and interior walls of the trench.

11. The method according to claim 10, wherein the metal barrier layer comprises tantalum nitride, titanium nitride, cobalt, ruthenium or tantalum, or a combination thereof.

12. The method according to claim 10, further comprising depositing a metal interconnect in the trench and over the metal barrier layer to substantially fill the trench.

* * * * *